United States Patent
Ichiki

(10) Patent No.: US 6,656,895 B2
(45) Date of Patent: Dec. 2, 2003

(54) REMOVER COMPOSITION

(75) Inventor: Naoki Ichiki, Tsukuba (JP)

(73) Assignee: Sumitomo Chemical Company, Limited, Osaka (JP)

(*) Notice: Subject to any disclaimer, the term of this patent is extended or adjusted under 35 U.S.C. 154(b) by 59 days.

(21) Appl. No.: 10/023,822

(22) Filed: Dec. 21, 2001

(65) Prior Publication Data

US 2002/0130298 A1 Sep. 19, 2002

(30) Foreign Application Priority Data

Dec. 27, 2000 (JP) ........................................ 2000-398547

(51) Int. Cl.⁷ ................................................. G03F 7/42
(52) U.S. Cl. ........................ 510/175; 510/176; 510/178; 510/212; 134/2; 134/3; 134/13; 134/42; 252/79.1
(58) Field of Search .................................. 510/175, 176, 510/178, 212, 504, 245, 254; 134/2, 3, 13, 42; 252/79.1

(56) References Cited

U.S. PATENT DOCUMENTS

| | | | |
|---|---|---|---|
| 4,401,747 A | | 8/1983 | Ward, Jr. et al. |
| 5,334,332 A | | 8/1994 | Lee |
| 5,482,566 A | | 1/1996 | Lee |
| 5,795,702 A | * | 8/1998 | Tanabe et al. ............... 430/331 |
| 5,798,323 A | * | 8/1998 | Honda et al. ................ 510/176 |
| 6,140,027 A | * | 10/2000 | Baik et al. .................. 430/331 |
| 6,423,480 B2 | * | 7/2002 | Ichiki ........................ 430/329 |

FOREIGN PATENT DOCUMENTS

| | | |
|---|---|---|
| JP | 59-49539 | 3/1984 |
| JP | 62-049355 | 4/1987 |
| JP | 4-350660 | 4/1992 |

* cited by examiner

Primary Examiner—Gregory E. Webb
(74) Attorney, Agent, or Firm—Birch, Stewart, Kolasch & Birch, LLP

(57) ABSTRACT

A remover composition comprising
(a) 100 parts by weight of a composition obtained by adding a cyclic urea compound to water, water-soluble organic solvent, or a mixture of water and water-soluble organic solvent so that the concentration of the cyclic urea compound is from 1 to 90% by weight, wherein the cyclic urea compound is represented by the following general formula (I):

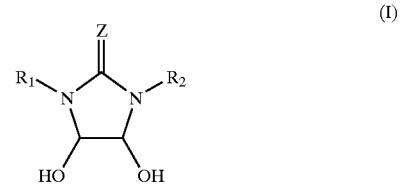

wherein, $R_1$ and $R_2$ each independently represent alkyl group which may be substituted, hydrogen atom, hydroxyl group, or carboxyl group, Z represents oxygen atom or sulfur atom,
(b) 0.1 to 150 parts by weight of an organic amine, and
(c) 0.001 to 100 parts by weight of a salt of an amine with an acid.

16 Claims, No Drawings

REMOVER COMPOSITION

BACKGROUND OF THE INVENTION

1. Field of the Invention

The present invention relates to a remover composition. More particularly, the present invention relates to a remover composition which removes a photoresist or residue generated in manufacturing a semiconductor.

2. Description of Related Art

Recently, formation of finer patterns of high precision is required due to increased concentration of integrated circuits, therefore, dry etching methods using a halogen-based gas are often used instead of conventional chemical etching methods, and further, ashing by oxygen plasma, ion injection and the like are conducted.

In such dry etching methods, ashing treatment and the like, a photoresist film is oxidized by a halogen-based etching gas, oxygen and the like, and changes from a film showing an organic property to a film showing an inorganic property, and changes into a film of poor solubility by an ion injection treatment.

Remover compositions are used for removing, photoresists and residues after dry etching remaining on the surface parts of wiring layers or insulation film layers, side wall parts of wiring layers or Via Holes, or bottom part of Via Holes, generated in forming wiring layers of a conductive metal and Via Hole.

As the remover composition, there is used, conventionally, a mixture of an organic alkali, inorganic alkali, organic acid, inorganic acid and polar organic solvent, or an aqueous solution thereof, and for example, JP-A No. 59-49539 discloses a remover composed of a 2-pyrrolidine compound and a dialkylsulfone compound, JP-A No. 4-350660 discloses a remover composed of 1,3-dimethyl-2-imidazolydinone and dimethylsulfoxide, JP-B No. 6-12455 discloses a remover composed of an alkanolamine, sulfone compound and glycol monoalkyl ether, and Japanese Patent No. 3048207 discloses a remover composed of (a) a nucleophilic amine such as hydroxylamine, hydrazine and the like, (b) an organic solvent, (c) a reducing agent such as catechol and the like, and (d) water, and the like.

With progress of size reduction of semiconductor elements, a problem of corrosion of a metal film used in a wiring layer also occurs in a process of removing a resist and a process of removing a residue after dry etching. When a metal film used in a wiring layer is corroded, resistance increases, leading to occurrence of problems such as increase in consumption power, heat generation from a semiconductor element, and the like.

However, the above-mentioned conventional releasing compositions have problems that ability of removing a resist and, a residue after dry etching is not sufficient, and corrosion of a metal film used in a wiring layer occurs, and the like.

Therefore, there is a desire for development of a remover composition having higher removing ability and does not easily cause corrosion of a metal film used in a wiring layer.

SUMMARY OF THE INVENTION

An object of the present invention is to solve the above-mentioned problems, and to provide a remover composition manifesting an extremely low corrosion property against materials such as an insulation film, metal film and the like constituting a semiconductor, and having a high ability of removing a photoresist and a residue generated in treating a semiconductor.

The present inventors have intensively studied a remover composition having no problems described above, and resultantly, found that a remover composition obtained by adding a cyclic urea compound having a specific structure manifests an extremely low corrosion property against materials such as an insulation film, metal film and the like, and has a high ability of removing a photoresist and a residue generated in treating a semiconductor element, and have completed the present invention.

Namely, the present invention relates to a remover composition comprising (a) 100 parts by weight of a composition obtained by adding a cyclic urea compound to water, water-soluble organic solvent, or a mixture of water and water-soluble organic solvent so that the concentration of the cyclic urea compound is from 1 to 90% by weight, wherein the cyclic urea compound is represented by the following general formula (I):

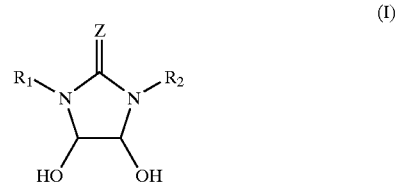

(I)

wherein, $R_1$ and $R_2$ each independently represent alkyl group which may be substituted, hydrogen atom, hydroxyl group, or carboxyl group, Z represents oxygen atom or sulfur atom, (b) 0.1 to 150 parts by weight of an organic amine, and (c) 0.001 to 100 parts by weight of a salt of an amine with an acid.

DETAILED DESCRIPTION OF THE PREFERRED EMBODIMENTS

The present invention will be explained in detail below.

The remover composition of the present invention is characterized in that it is obtained by addition of a cyclic urea compound of the general formula (I) so that the concentration thereof is from 1 to 90% by weight, or it contains a cyclic urea compound of the general formula (I) so that the concentration thereof is from 1 to 90% by weight. The addition amount or content of the cyclic urea compound is preferably from 10 to 60% by weight, particularly preferably from 10 to 40% by weight.

Specifically, the remover composition of the present invention is prepared by adding the above-mentioned cyclic urea compound to water and/or organic solvent, or contains the above-mentioned cyclic urea compound in water and/or organic solvent.

Namely, the remover composition of the present invention is characterized in that it is obtained by adding of a cyclic urea compound of the general formula (I) to water and/or water-soluble organic solvent so that the concentration thereof is from 1 to 90% by weight, or it contains a cyclic urea compound of the general formula (I) in water and/or water-soluble organic solvent so that the concentration thereof is from 1 to 90% by weight. The addition amount or content of the cyclic urea compound is preferably from 10 to 60% by weight, particularly preferably from 10 to 40% by weight.

When the concentration is less than 1% by weight, releasing property for a photoresist and etching residue is insufficient. On the other hand, when the concentration is over 90% by weight, releasing property for an etching residue is insufficient.

In a cyclic urea compound of the general formula (I) in the present invention, $R_1$ and $R_2$ each independently represent a hydrogen atom, hydroxyl group, carboxyl group or alkyl group optionally substituted. Z represents an oxygen atom or sulfur atom.

When $R_1$ and $R_2$ represent an alkyl group optionally substituted, groups of the following general formula (II):

(wherein, n represents an integer of 1 or more. X represents a hydrogen atom, hydroxyl group, methoxy group or ethoxy group.) are listed for $R_1$ and $R_2$ each independently.

From the standpoint of sufficient ability for removing a photoresist and an etching residue, preferable $R_1$ and $R_2$ represent a hydrogen atom or an alkyl group optionally substituted of the general formula (II), n represents preferably 1 to 4, particularly preferably 1 to 2. Further, in view of raw material circumstances together, it is preferable that $R_1$=$R_2$.

Examples of the cyclic urea compound of the general formula (I) include 4,5-dihydroxy-2-imidazolidinone, 4,5-dihydroxy-1,3-dimethyl-2-imidazolidinone, 4,5-dihydroxy-1,3-bis(hydroxymethyl)-2-imidazolidinone, 4,5-dihydroxy-1,3-bis(methoxymethyl)-2-imidazolidinone, and the like.

Examples of the organic solvent in the present invention include alcohols such as methanol, ethanol, n-propyl alcohol, isopropyl alcohol, n-butanol, t-butyl alcohol, pentanol, ethylene glycol, glycerin and the like; amides such as N-methylformamide, N,N-dimethylformamide, N,N-dimethylacetamide, N-methyl-2-pyrrolidone and the like; lactones such as γ-butyrolactone and the like; esters such as propyl acetate, butyl acetate, butyl propionate, ethyl butyrate, butyl butryrate, methyl lactate, ethyl lactate and the like; ketones such as acetone, methyl ethyl ketone, acetylacetone, methyl butyl ketone, 3-pentanone, 2-heptanone and the like; ethers such as diethyl ether, dipropyl ether, dibutyl ether, oxirane, dioxane and the like; glycol monoethers such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monomethyl ether and the like; furan such as tetrahydrofuran, furaldehyde, tetrahydrofurfurylalchol and the like; sulfolanes such as sulfolane and the like; sulfoxide such as dimethylsulfoxide and the like; urea compounds such as dimethylimidazolidinone and the like, hydrocarbons such as pentane, hexane, heptane,cyclohexane and the like, and other solvents. Among them, water-soluble organic solvents having a solubility in water of 8% or more are preferable.

Examples of the water-soluble organic solvent in the present invention include alcohols such as methanol, ethanol, n-propyl alcohol, isopropyl alcohol, ethylene glycol, glycerin and the like; amides such as N-methylformamide, N,N-dimethylformamide, N,N-dimethylacetamide, N-methyl-2-pyrrolidone and the like; lactones such as γ-butyrolactone and the like; esters such as methyl lactate, ethyl lactate and the like; ketones such as acetone, methyl ethyl ketone, acetylacetone and the like; ethers such as ethylene glycol monomethyl ether, ethylene glycol monoethyl ether, diethylene glycol monomethyl ether, diethylene glycol monoethyl ether, ethylene glycol monobutyl ether, diethylene glycol monobutyl ether, triethylene glycol monomethyl ether and the like; furan such as tetrahydrofuran, furaldehyde, tetrahydrofurfurylalchol and the like; sulfolanes such as sulfolane and the like; sulfoxide such as dimethylsulfoxide and the like; urea compounds such as dimethylimidazolidinone and the like, and other solvents. Further preferably, N-methyl-2-pyrrolidone, methanol, dimethylsulfoxide and the like are listed. These water-soluble organic solvents may be used alone or in combination of two or more.

It is preferable that the remover composition of the present invention further contains organic amines. Regarding preferable ratio thereof, the remover composition comprises 100 parts by weight of a remover composition which is prepared by adding 1 to 90 weight % of a cyclic urea compound of the general formula (I) to water and/or water-soluble organic solvent, or contains this cyclic urea compound in water and/or water-soluble organic solvent, and 0.1 to 150 parts by weight, further preferably 1.0 to 100 parts by weight, particularly preferably 5.0 to 50 parts by weight of organic amines.

When the ratio of the organic amines is over 150 parts by weight, corrosion of an insulation film or conductive metal on a substrate may occur, and when less than 0.1 part by weight, releasing property may be insufficient for a resist and an etching residue.

The organic amines are selected from the group consisting of alkanolamines and alkylammonium hydroxides. These amines may be used alone or in combination of two or more. As the above-mentioned alkanolamine, monoethanolamine, diethanolamine, triethanolamine, 2-(2-aminoethoxy)ethanol and the like are listed. As the above-mentioned alkylammonium hydroxide, tetramethylammonium hydroxide, tetraethylammonium hydroxide and the like are listed. These organic amines may be used alone or in combination of two or more.

The remover composition of the present invention preferably contains a salt of amines with an acid. Further, the remover composition of the present invention preferably contains a salt of amines with an acid, in addition to the above-mentioned organic amines.

Specifically, the remover composition of the present invention comprises 100 parts by weight of the above-mentioned remover composition and 0.001 to 100 parts by weight, preferably 0.1 to 50 parts by weight, particularly preferably 1.0 to 25 parts by weight of additives. The addition amount of the above-mentioned additives is also applied to a remover composition containing organic amines added.

In the salt of amines with an acid, the amines are selected from alkanolamines and alkylammonium hydroxides, and hydroxylamines, and the acid is selected from the group consisting of hydrochloric acid, nitric acid, sulfuric acid, carboxylic acids. A salt can be obtained by combining these amines with an acid. As the above-mentioned alkanolamine, monoethanolamine, diethanolamine, triethanolamine, 2-(2-aminoethoxy)ethanol and the like are listed. As the above-mentioned alkylammonium hydroxide, hydromethylammonium hydroxide, tetraethylammonium hydroxide and the like are listed. As the above-mentioned hydroxylamines, hydroxylamine, N,N-diethylhydroxylamine and the like are listed. As the carboxylic acids, formic acid, acetic acid, oxalic acid and the like are listed. These salts of amines with an acid may be used alone or in combination of two or more.

Regarding the salt of amines with an acid, those manifesting particularly an effect of releasing a photoresist and etching residue can be used, and for example, monoethanolamine hydrochlorides, hydroxylamine hydrochlorides, hydroxylamine sulfates and the like are listed. These may be used alone or in combination of two or more. When the concentration of the additive is over 100 parts by weight, solubility may decrease or corrosion of a metal film on a substrate may occur, when less than 0.001 part by weight, an ability of removing an etching residue may decrease.

The remover composition of the present invention preferably contains an additive. Further, the remover composition of the present invention preferably contains an additive in addition to the above-mentioned organic amines.

Regarding specific ratios, the remover compositions of the present invention comprising 100 parts by weight of the above-mentioned remover composition and 0.001 to 100 parts by weight, preferably 0.1 to 50 parts by weight, particularly preferably 1.0 to 25 parts by weigh of an additive, are listed. The addition amount of the above-mentioned additive is applied also to a remover composition containing organic amines added.

As the additive, there can be used reducing agents and chelating agents, particularly, those having an effect as a corrosion inhibiting agent for a metal can be used, and examples thereof include aromatic hydroxy compounds, triazole compounds and the like. These may be used alone or in combination of two or more. When the concentration of the additive is over 100 parts by weight, the additive may remain on a substrate after treatment with a remover, and when less than 0.001 part by weight, corrosion of a metal film on a substrate may occur.

As the above-mentioned aromatic hydroxy compound, hydroquinone, catechol, resorcinol, pyrogallol and the like are listed, and among them, catechol is preferable. As the above-mentioned triazole compound, benzotriazole, carboxybenzotriazole, 1-hydroxybenzotriazole, 3-aminotriazole and the like are listed, and of them, benzotriazole is preferable. As the other additives, polyethyleneimide, thioglycol and the like are listed. These compounds may be used alone or in combination of two or more.

The remover composition of the present invention manifest extremely low corrosion property for materials such as an insulation film and metal film (film made of aluminum, tungsten, copper, platinum and the like) and the like constituting a semiconductor element, and the remover composition is particularly suitable for copper and aluminum, among them.

A cyclic urea compound of the general formula (I) can be obtained by reacting the corresponding urea compound or thiourea compound with glyoxal by a usual method, or introducing an N-substituent into a reaction product of urea or thiourea with glyoxal ($R_1$=$R_2$=H in the general formula (I)) by a usual method.

For obtaining the remover composition of the present invention, the above-mentioned compounds may be mixed in give amounts. The mixing method is not particularly restricted, and various known methods can be applied.

The remover composition of the present invention is excellent in an ability of removing a photoresist and a residue generated in dry etching treatment, can suppress corrosion tendency of materials such as an insulation film, metal film and the like constituting a semiconductor element, and is suitably used in a process of washing semiconductor elements such as an LSI element, liquid crystal panel element and the like.

The method of removing a photoresist of the present invention is characterized in that it removes a photoresist by using the remover composition of the present invention, in a process of producing a semiconductor.

Further, the method of removing a residue of a semiconductor element of the present invention is characterized in that it removes a residue generated in semiconductor treatment, particularly in dry etching treatment, by using the remover composition of the present invention, in a process of producing a semiconductor.

Here, the residue means ashing residue, etching residue and the like.

Specifically, in a method of removing a resist and etching residue by using the remover composition of the present invention, an LSI element and liquid crystal panel element may be advantageously be washed with the remover composition of the present invention using an immersion method or spray washing method at temperatures from 10 to 100° C.

EXAMPLES

The following example illustrate the present invention further in detail below, but the scope of the invention is not restricted by this example.

Example 1–3, Comparative Example 1

In a substrate comprising a silicon wafer, a titanium nitride (TiN) layer as the first layer on the wafer, an aluminum layer as the second layer on the first layer, and an insulation film (silicon oxide ($SiO_2$)) layer as the third layer on the second layer, via holes were formed by dry etching using a resist film as a mask, subsequently, the resist film was removed by ashing using oxygen plasma. Residues which cannot be removed by oxygen plasma were present on the upper part of the insulation film, the wall part of the via hole and the bottom part of the via hole.

This wafer was immersed in a remover composition shown in Table 1 or Table 3 under treatment conditions shown in Table 2 or Table 4, then, rinsed with ultrapure water and dried, and observed by a scanning electron microscope (SEM). The property of releasing residues and property of corroding of a copper layer were evaluated and the results are shown in Table 2 or Table 4. The evaluation criteria in SEM observation are as described below.

Releasing Property

⊚: complete removal

Δ: partial remaining is recognized

X: most part remain

Corrosion Property

⊚: corrosion is not recognized at all

Δ: partial corrosion is recognized

X: severe corrosion is recognized

TABLE 1

|  |  | Example 1 | Comparative example 1 |
|---|---|---|---|
| Compound of the formula (I): A | part by weight | 12.0 | 12.0 |
| Water | part by weight | 18.0 | 18.0 |
| Water-soluble organic solvent: EGB | part by weight | 39.0 | 39.0 |
| Organic amines: MEA | part by weight | 20.0 | 20.0 |
| Additive: catechol | part by weight | 10.0 | 11.0 |

TABLE 1-continued

|  |  | Example 1 | Comparative example 1 |
|---|---|---|---|
| BTA | part by weight | 1.0 | 1.0 |
| HAS | part by weight | 3.0 | — |

A: 4,5-dihydroxy-1,3-dimethyl-2-imidazolidinone
MEA: monoethanolamine
EGB: ethylene glycol monobutyl ether
BTA: benzotriazole
HAS: hydroxylammonium sulfate

TABLE 2

|  | Example 1 | Comparative example 1 |
|---|---|---|
| Treating condition: temperature (° C.) | 70 | 70 |
| time (minute) | 10 | 10 |
| Result: releasing property | ⊚ | Δ |
| corrosion property | ⊚ | ⊚ |

TABLE 3

|  |  | Example 2 | Example 3 |
|---|---|---|---|
| Compound of the formula (I): A | part by weight | 6.0 | 6.0 |
| Water | part by weight | 23.0 | 24.0 |
| Water-soluble organic solvent: THFA | part by weight | 12.5 | 23.0 |
| DMSO | part by weight | 7.5 | 5.0 |
| Organic amines: MEA | part by weight | 25.0 | 25.0 |
| Additive: catechol | part by weight | 2.0 | 2.0 |
| BTA | part by weight | 1.0 | — |
| HAS | part by weight | 23.0 | 15.0 |

A: 4,5-dihydroxy-1,3-dimethyl-2-imidazolidinone
MEA: monoethanolamine
THFA: tetrahydro furfuryl alchol
DMSO: dimethylsulfoxide
BTA: benzotriazole
HAS: hydroxylammonium sulfate

TABLE 4

|  | Example 2 | Example 3 |
|---|---|---|
| Treating condition: temperature (° C.) | 70 | 70 |
| time (minute) | 15 | 15 |
| Result: releasing property | ⊚ | ⊚ |
| corrosion property | ⊚ | ⊚ |

The remover composition of the present invention is excellent in an ability of removing a photoresist and a residue generated in dry etching treatment, and manifest extremely low corrosion property of materials such as an insulation film, metal film and the like constituting a semiconductor element, therefore, is suitably used in a process of washing semiconductor elements such as an LSI element, liquid crystal panel element and the like.

What is claimed is:
1. A remover composition comprising
   (a) 100 parts by weight of a composition obtained by adding a cyclic urea compound to water, water-soluble organic solvent, or a mixture of water and water-soluble organic solvent so that the concentration of the cyclic urea compound is from 1 to 90% by weight, wherein the cyclic urea compound is represented by the following general formula (I):

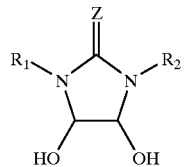

wherein, $R_1$ and $R_2$ each independently represent alkyl group which may be substituted, hydrogen atom, hydroxyl group, or carboxyl group, Z represents oxygen atom or sulfur atom,
   (b) 0.1 to 150 parts by weight of an organic amine, and
   (c) 0.001 to 100 parts by weight of a salt of an amine with an acid.
2. The remover composition according to claim 1, wherein the organic amine is selected from the group consisting of alkanolamine and alkylammonium hydroxide.
3. The remover composition according to claim 1, wherein the amine is selected from the group consisting of alkanolamine, alkylammonium hydroxide and hydroxylamine, and the acid is selected from the group consisting of hydrochloric acid, sulfuric acid, nitric acid and carboxylic acid.
4. A remover composition according to claim 1 further comprising an additive.
5. The remover composition according to claim 4, wherein the additive is selected from the group consisting of an aromatic hydroxy compound and a triazole compound.
6. A process for removing a photoresist with the remover composition according to claim 1.
7. A process for removing a residue of a semiconductor element generated in semiconductor treatment with the remover composition according to claim 1.
8. The process according to claim 7, wherein the semiconductor treatment is dry etching treatment.
9. A remover composition comprising
   (a) 100 parts by weight of a composition containing a cyclic urea compound in water, water-soluble organic solvent, or a mixture of water and water-soluble organic solvent so that the concentration of the cyclic urea compound is from 1 to 90% by weight, wherein the cyclic urea compound is represented by the following general formula (I):

wherein, $R_1$ and $R_2$ each independently represent alkyl group which may be substituted, hydrogen atom, hydroxyl group, or carboxyl group, Z represents an oxygen atom or sulfur atom,
   (b) 0.1 to 150 parts by weight of an organic amine, and
   (c) 0.001 to 100 parts by weight of a salt of an amine with an acid.
10. The remover composition according to claim 9, wherein the organic amine is selected from the group consisting of alkanolamine and alkylammonium hydroxide.
11. The remover composition according to claim 9, wherein the amine is selected from the group consisting of alkanolamine, alkylammonium hydroxide and hydroxylamine, and the acid is selected from the group consisting of hydrochloric acid, sulfuric acid, nitric acid and carboxylic acid.

12. The remover composition according to claim 9 further comprising an additive.

13. The remover composition according to claim 12, wherein the additive is selected from the group consisting of an aromatic hydroxy compound and a triazole compound.

14. A process for removing a photoresist with the remover composition according to claim 9.

15. A process for removing a residue of a semiconductor element generated in semiconductor treatment with the remover composition according to claim 9.

16. The process according to claim 15, wherein the semiconductor treatment is dry etching treatment.

* * * * *